(12) United States Patent　　(10) Patent No.: US 10,273,994 B1
Foster　　(45) Date of Patent: Apr. 30, 2019

(54) LATCH SYSTEM FOR MODULAR DISPLAY PANEL

(71) Applicant: Ultravision Technologies, LLC, Dallas, TX (US)

(72) Inventor: Matthew Foster, Flower Mound, TX (US)

(73) Assignee: Ultravision Technologies, LLC, Dallas, TX (US)

( * ) Notice: Subject to any disclaimer, the term of this patent is extended or adjusted under 35 U.S.C. 154(b) by 0 days.

(21) Appl. No.: 15/955,261

(22) Filed: Apr. 17, 2018

(51) Int. Cl.
　　*H05K 7/00*　　(2006.01)
　　*F16B 5/06*　　(2006.01)
　　*F16B 2/18*　　(2006.01)
　　*H05K 7/14*　　(2006.01)
　　*H05K 7/02*　　(2006.01)
　　*H05K 5/00*　　(2006.01)

(52) U.S. Cl.
　　CPC .............. *F16B 5/0685* (2013.01); *F16B 2/18* (2013.01); *H05K 5/0017* (2013.01); *H05K 7/023* (2013.01); *H05K 7/1401* (2013.01)

(58) Field of Classification Search
　　CPC .... H05K 5/0017; H05K 7/023; H05K 7/1401; F16B 2/18; F16B 5/0658
　　USPC ......................................................... 361/729
　　See application file for complete search history.

(56) References Cited

U.S. PATENT DOCUMENTS

| | | | | |
|---|---|---|---|---|
| 2,287,117 | A * | 6/1942 | Montalto | B65H 54/543 403/324 |
| 4,167,772 | A * | 9/1979 | Baehne | H05K 7/1417 174/138 D |
| 5,452,979 | A * | 9/1995 | Cosenza | B60R 21/2035 411/348 |
| 5,654,876 | A * | 8/1997 | Sathe | H01L 23/4006 257/718 |
| 9,081,552 | B1 * | 7/2015 | Hall | G06F 3/1446 |

* cited by examiner

*Primary Examiner* — Hung S. Bui
(74) *Attorney, Agent, or Firm* — Slater Matsil, LLP

(57) ABSTRACT

A display panel includes a frame and a plurality of panels. Each of the panels is attached to the frame by a first spring-latch. The first spring latch is configured to switch between a fastened position and an unfastened position by pressing the panel towards the frame and releasing the panel.

22 Claims, 15 Drawing Sheets

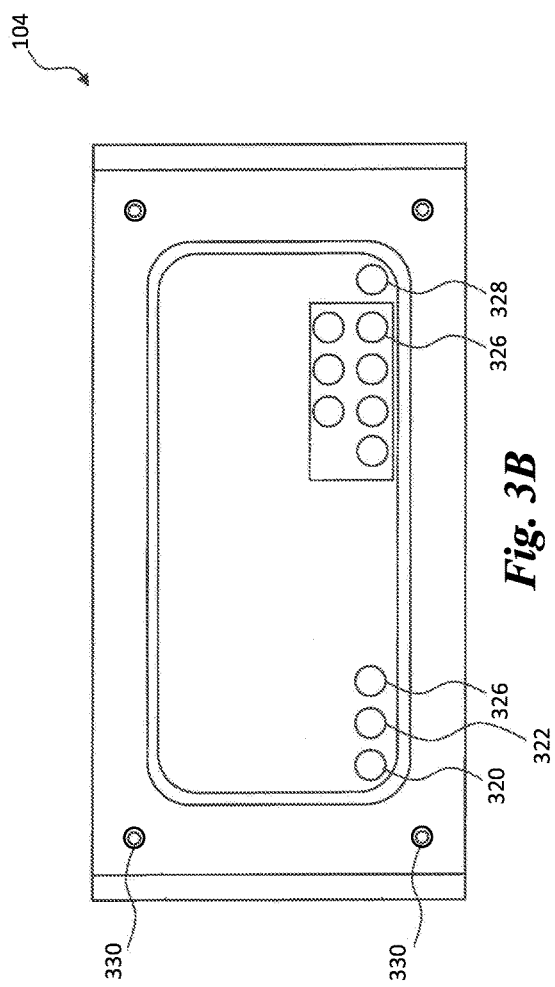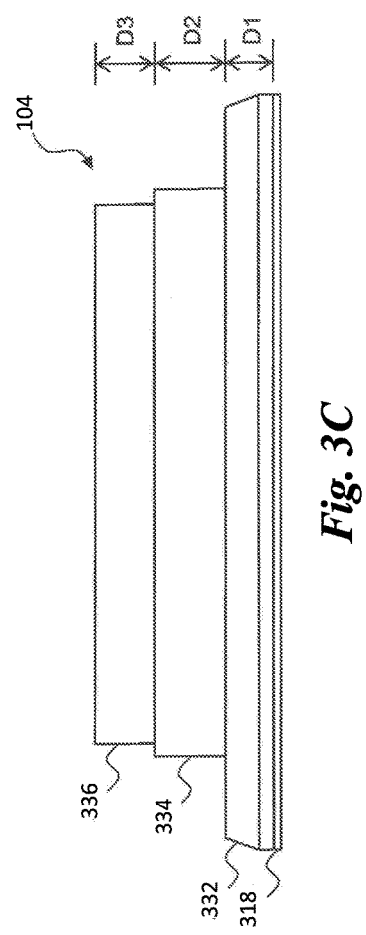
Fig. 3B
Fig. 3C

LATCH SYSTEM FOR MODULAR DISPLAY PANEL

TECHNICAL FIELD

The present invention relates generally to displays, and, in particular embodiments, to a system and method for attaching a display panel to a frame using a latch.

BACKGROUND

Large displays (e.g., billboards), such as those commonly used for advertising in cities and along roads, are widely used to display images, video, or text. The graphics may be projected on a single panel or extended across multiple panels. Each panel may have an array of light emitting diodes (LEDs) to generate the visual graphics. The LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

The panels may be installed in a frame using bolts, magnets, or by latching the panels to each other and then to the frame. However, these methods of attaching the panels to a frame are slow and cumbersome. Moreover, some of these methods require specialty tools in order to install and replace the panels.

SUMMARY

Technical advantages are generally achieved by embodiments of this disclosure which describe systems and methods for mounting a display panel.

In accordance with an embodiment, a multi-panel display includes a frame and a plurality of panels, each of the panels being attached to the frame by a first spring-latch, the first spring-latch being configured to switch between a fastened position and an unfastened position by pressing the panel towards the frame and releasing the panel. In an embodiment, the multi-panel display further includes a plurality of sub-assemblies, each of the plurality of panels being attached to a corresponding one of the sub-assemblies, each of the sub-assemblies being attached to the frame. In an embodiment, frame includes a plurality of holes, and each spring latch of the at least one spring-latch is configured to be fastened to a corresponding one of the plurality of holes. In an embodiment, each of the panels of the plurality of panels includes a plurality of light emitting diodes (LEDs) attached to a front side of the panel, and the at least one spring-latch is attached to the front side of the panel. In an embodiment, each of the panels of the plurality of panels includes a plurality of light emitting diodes (LEDs) attached to a front side of the panel, and the at least one spring-latch is attached to the back side of the panel. In an embodiment, each of the panels is attached to the frame by four spring-latches, each of the spring-latches being disposed in a separate corner of the panel. In an embodiment, each of the panels is attached to the frame by two spring-latches, each of the spring-latches being disposed on a same side of the panel. In an embodiment, each of the panels of the plurality of panels further includes a plurality of posts, the plurality of posts being configured to align the panel with the frame.

In accordance with another embodiment, a display panel includes a display surface at a first side, a spring-latch at an opposite side, the spring latch including a post; a butterfly pawl attached to the post by a pivot, the butterfly pawl being rotatable around the pivot, the butterfly pawl being rotatable between a fastened position and an unfastened position; a collar disposed around the post, the collar being configured to move up and down the post; a first spring connected to the collar, the first spring configured to push the collar up the post; a ball disposed below the butterfly pawl; and a second spring configured to press the ball against the butterfly pawl. In an embodiment, the post has a circular shape in a cross-sectional view. In an embodiment, the post has an ellipsoidal shape in a cross-sectional view. In an embodiment, the post includes one or more grooves in a cross-sectional view. In an embodiment, the collar is configured to move the butterfly pawl between the fastened position and the unfastened position. In an embodiment, the collar is configured to move vertically up or down the post past the butterfly pawl when the butterfly pawl is in the unfastened position, and the collar is configured to only move vertically down the post past the butterfly pawl when the butterfly pawl is in the fastened position.

In accordance with yet another embodiment, a method for mounting a display panel includes providing a display panel including a spring-latch; providing a frame including an opening, the opening corresponding to the spring-latch; inserting the spring-latch into the opening; and attaching the display panel to the frame by pressing the display panel towards the frame and releasing the display panel such that the spring-latch switches from an unfastened position to a fastened position. In an embodiment, the spring-latch includes a butterfly pawl, and switching the spring-latch from the unfastened position to the fastened position includes rotating the butterfly pawl from a first position to a second position. In an embodiment, the method further includes removing the display panel from the frame by pressing the display panel towards the frame such that the spring-latch switches from the fastened position to the unfastened position. In an embodiment, the spring-latch includes a collar configured to contact the frame, a spring configured to contact the collar, and a butterfly pawl configured to switch between the fastened position and the unfastened position, and after the display panel is released, the spring presses the collar away from the display panel such that the collar rotates the butterfly pawl into the fastened position. In an embodiment, a lever is used to press the display panel towards the frame. In an embodiment, the method further includes locking the display panel to the frame, the locking preventing the display panel from being removed from the frame by pressing the display panel towards the frame. In an embodiment, the display panel is locked to the frame using a magnetic keyed lock. In an embodiment, the display panel is locked to the frame using a mechanical arm that locks the butterfly pawl.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3C illustrate a front view, a back view, and a top-down view, respectively, of a panel, in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

This disclosure provides many applicable inventive concepts that can be embodied in a wide variety of specific contexts. The specific embodiments discussed are merely illustrative of specific ways to make and use the invention, and do not limit the scope of the invention.

In the following embodiments, exterior displays are used herein for purposes of example. It is understood that the present disclosure may be applied to display panels for any type of interior and/or exterior display.

Figure 1A:
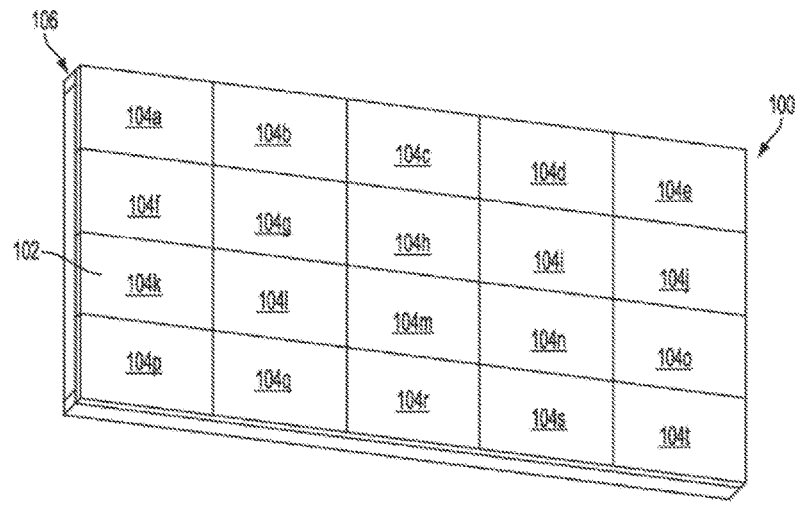
FIGS. 1A and 1B respectively illustrate a front view and a back view of a multi-panel display, respectively, in accordance with an embodiment.
Figure 1B:
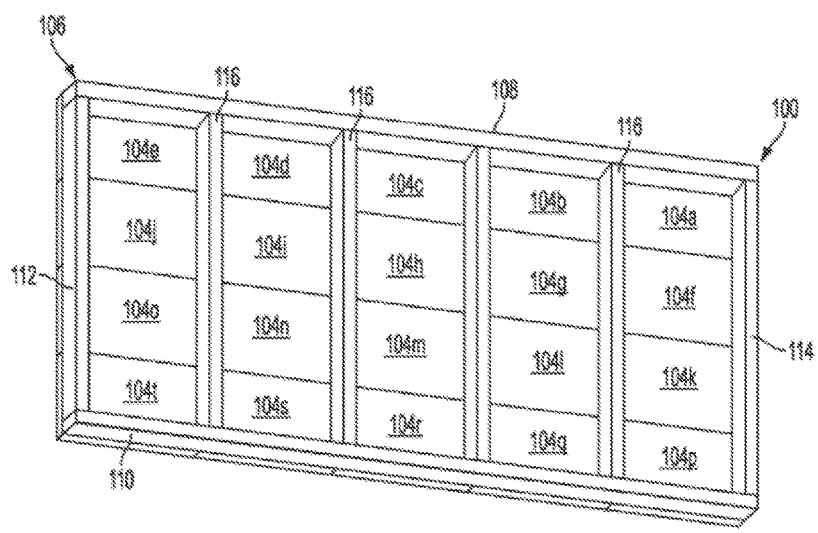

FIGS. 1A and 1B respectively illustrate a front view and a back view of a multi-panel display 100, in accordance with an embodiment. The multi-panel display 100 (hereinafter referred to as a "display") includes a display surface 102 formed by a plurality of lighting panels 104a-104t (hereinafter referred to as "panels 104") arranged as an array of panels 104. Each panel 104 of the array of panels 104 is electrically connected to an adjacent panel 104 within the same row and/or an adjacent panel 104 within the same column. In the present embodiment, the panels 104 use light emitting diodes (LEDs) for illumination; however, other light sources may be used in other embodiments. The panels 104 typically operate together to form a single image across the display surface 102, although multiple images may be simultaneously displayed by the display 100. In the present example, each of the panels 104 is attached to a frame 106 (e.g., shown in FIG. 1B), which enables each of the panels 104 to be installed or removed from the display 100 without affecting other panels 104.

In the display 100 of FIGS. 1A and 1B, each panel 104 is a self-contained unit that couples directly to the frame 106. By "directly," it is understood that another component or components may be positioned between the panel 104 and the frame 106, but the panel 104 is not placed inside weather protection cabinetry that is coupled to the frame 106. For example, an alignment plate may be coupled to a panel 104 and/or the frame 106 to aid in aligning the panel 104 with other panels 104. Further a corner plate could be used. The panel 104 may then be coupled to the frame 106 or the alignment plate and/or corner plate, and either coupling approach would be "direct" according to the present disclosure.

A first panel 104 can be coupled, for power and/or data purposes, with a second panel 104 that receives power and/or data from a central source or a third panel 104. The second panel 104 may also pass through at least some of the power and/or data to a fourth panel 104. This further improves the modular aspect of the display 100, since a single panel 104 can be easily installed in the display 100 by coupling the power and data connections of the single panel 104 to neighboring panels 104. Similarly, a single panel 104 can be easily disconnected from the display 100 by decoupling the power and data connections of the single panel 104 from neighboring panels 104.

The power and data connections for the panels 104 may be configured using one or more layouts, such as a ring, mesh, star, bus, tree, line, or fully-connected layout, or a combination thereof. In some embodiments the panels 104 may be in a single network, while in other embodiments the panels 104 may be divided into multiple networks. Power and data may be distributed using identical or different layouts. For example, power may be distributed in a line layout, while data may use a combination of line and star layouts.

The frame 106 that supports the panels 104 may be relatively light in weight compared to frames needed to support cabinet-mounted LED assemblies. In the present example, the frame 106 includes a top horizontal member 108, a bottom horizontal member 110, a left vertical member 112, a right vertical member 114, and intermediate vertical members 116, as illustrated in FIG. 1B. Power cables and data cables (not shown in FIGS. 1A-1B) for the panels 104 may route around and/or through the frame 106.

In one embodiment, the display 100 includes 336 panels 104 to create a 14 feet×48 feet display 100. In such an embodiment, the entire display 100 could be built to weigh only 5500 pounds. This compares favorably to commercially available displays of similar size, which generally weigh from 10,000 to 12,000 pounds. In another embodiment, the display 100 includes 320 panels 104 arranged in ten rows and thirty-two columns to create an approximately 16 feet×50 feet display 100.

Figure 2A:
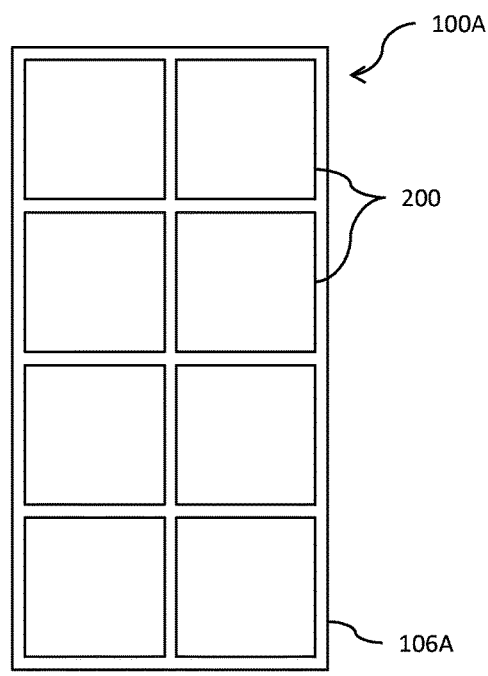
FIGS. 2A and 2B illustrate front views of displays including sub-assemblies attached to frames, in accordance with various embodiments.
Figure 2B:
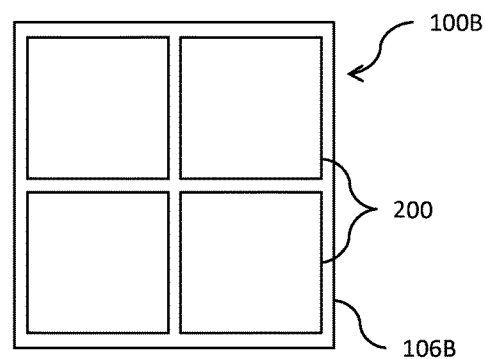

FIGS. 2A and 2B illustrate front views of a first display 100A and a second display 100B, respectively. The first display 100A and the second display 100B (collectively referred to as "displays 100") include sub-assemblies 200 attached to a first frame 106A or a second frame 106B (collectively referred to as "frames 106"), respectively. As will be discussed below, each of the sub-assemblies 200 may include a plurality of panels 104. In the present example, each of the sub-assemblies 200 is attached to a frame 106, which enables each of the sub-assemblies 200 to be installed or removed from a display 100 without affecting other sub-assemblies 200.

In the displays 100 of FIGS. 2A and 2B, each sub-assembly 200 is a self-contained unit that couples directly to a frame 106. By "directly," it is understood that another component or components may be positioned between the sub-assembly 200 and the frame 106, but the sub-assembly 200 is not placed inside weather protection cabinetry that is coupled to the frame 106. For example, an alignment plate may be coupled to a sub-assembly 200 and/or the frame 106 to aid in aligning the sub-assembly 200 with other sub-assemblies 200. Further a corner plate could be used. The sub-assembly 200 may then be coupled to the frame 106 or the alignment plate and/or corner plate, and either coupling approach would be "direct" according to the present disclosure.

A first sub-assembly 200 can be coupled, for power and/or data purposes, with a second sub-assembly 200 that receives power and/or data from a central source or a third sub-assembly 200. The second sub-assembly 200 may also pass through at least some of the power and/or data to a fourth sub-assembly 200. This further improves the modular aspect of the displays 100, since a single sub-assembly 200 can be easily installed in the displays 100 by coupling the power and data connections of the single sub-assembly 200 to neighboring sub-assemblies 200. Similarly, a single sub-assembly 200 can be easily disconnected from the displays 100 by decoupling the power and data connections of the single sub-assembly 200 from neighboring sub-assemblies 200.

The power and data connections for the sub-assemblies 200 may be configured using one or more layouts, such as a ring, mesh, star, bus, tree, line, or fully-connected layout, or a combination thereof. In some embodiments the sub-assemblies 200 may be in a single network, while in other embodiments the sub-assemblies 200 may be divided into multiple networks. Power and data may be distributed using identical or different layouts. For example, power may be distributed in a line layout, while data may use a combination of line and star layouts.

In one embodiment, as shown in FIG. 2A, the first display 100A includes eight sub-assemblies 200 arranged in the first frame 106A in two columns and four rows to create a display 100 having a width to height ratio (hereinafter referred to as an "aspect ratio") of 1:2. In another embodiment, as shown in FIG. 2B, the second display 100B includes four sub-assemblies 200 arranged in the frame 106B in two columns and two rows to create a display 100 having an aspect ratio of 1:1. In other embodiments, the frame 106 may include any number of sub-assemblies 200 to create a desired aspect ratio, such as an aspect ratio of 1:2, 1:1, 16:9, 8:9, 4:3, 2:1, 3:1, 1.85:1, 2.39:1, or any other desired aspect ratio.

Figure 2C:
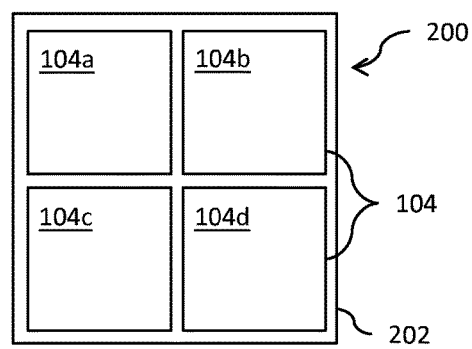
FIGS. 2C-2F illustrate front views of sub-assemblies including panels attached to sub-assembly frames, in accordance with various embodiments.

FIGS. 2C-2F illustrate front views of sub-assemblies 200 including panels 104 attached to sub-assembly frames 202, in accordance with various embodiments. As depicted in FIG. 2C, a sub-assembly 200 may include a plurality of panels 104 attached to a sub-assembly frame 202. In the present example, each of the panels 104 is attached to the sub-assembly frame 202, which enables each of the panels 104 to be installed or removed from the sub-assembly 200 without affecting the other panels 104.

The sub-assembly 200 of FIG. 2C may be the same as the sub-assemblies 200 discussed above in reference to FIGS. 2A and 2B. In the sub-assembly 200, each panel 104 is a self-contained unit that couples directly to the sub-assembly frame 202. By "directly," it is understood that another component or components may be positioned between the panels 104 and the sub-assembly frame 202, but the panels 104 are not placed inside weather protection cabinetry that is coupled to the sub-assembly frame 202. For example, an alignment plate may be coupled to a panel 104 and/or the sub-assembly frame 202 to aid in aligning the panel 104 with other panels 104. Further a corner plate could be used. The panel 104 may then be coupled to the sub-assembly frame 202 or the alignment plate and/or corner plate, and either coupling approach would be "direct" according to the present disclosure.

A first panel 104a can be coupled, for power and/or data purposes, with a second panel 104b that receives power and/or data from a central source or a third panel 104c. The second panel 104b may also pass through at least some of the power and/or data to a fourth panel 104d. This further improves the modular aspect of the sub-assembly 200, since a single panel 104 can be easily installed in the sub-assembly 200 by coupling the power and data connections of the single panel 104 to neighboring panels 104. Similarly, a single panel 104 can be easily disconnected from the sub-assembly 200 by decoupling the power and data connections of the single panel 104 from neighboring panels 104.

The power and data connections for the panels 104 may be configured using one or more layouts, such as a ring, mesh, star, bus, tree, line, or fully-connected layout, or a combination thereof. In some embodiments the panels 104 may be in a single network, while in other embodiments the panels 104 may be divided into multiple networks. Power and data may be distributed using identical or different layouts. For example, power may be distributed in a line layout, while data may use a combination of line and star layouts.

Figure 2D:
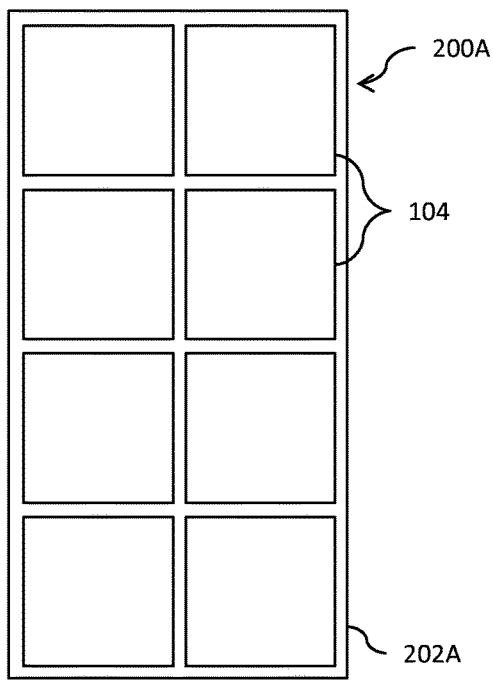

In one embodiment, as shown in FIG. 2C, the sub-assembly 200 includes four panels 104 arranged in the sub-assembly frame 202 in two columns and two rows. The sub-assembly 200 has an aspect ratio of 1:1. In another embodiment, as shown in FIG. 2D, a second sub-assembly 200A includes eight panels 104 arranged in a second sub-assembly frame 202A in two columns and four rows. The second sub-assembly 200A has an aspect ratio of 1:2. As illustrated in FIGS. 2C and 2D, each of the panels 104 may have an aspect ratio of 1:1.

Figure 2E:
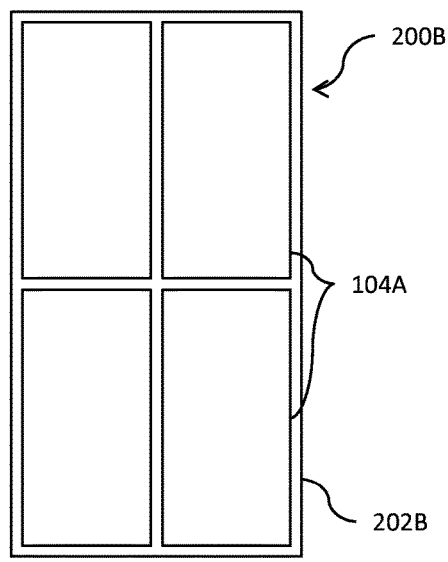
Figure 2F:
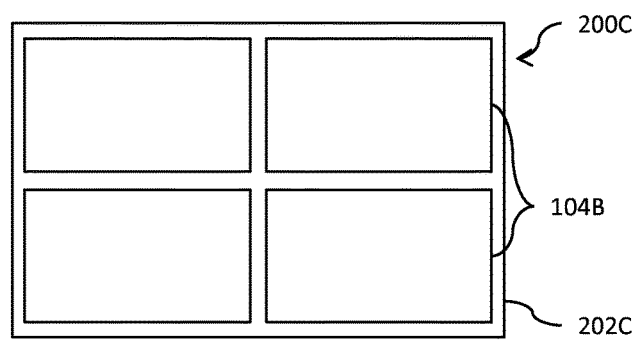

In an embodiment, as shown in FIG. 2E, a third sub-assembly 200B includes four panels 104A arranged in a third sub-assembly frame 302B in two columns and two rows. The third sub-assembly 200B has an aspect ratio of 1:2. In another embodiment, as shown in FIG. 2F, a fourth sub-assembly 200C includes four panels 104B arranged in a fourth sub-assembly frame 302C in two columns and two rows. The fourth sub-assembly 200C has an aspect ratio of 16:9. As illustrated in FIGS. 2E and 2F, each of the panels 104 may have an aspect ratio of 1:2 or 16:9, respectively.

In other embodiments, the panels 104 may have aspect ratios of 1:2, 1:1, 16:9, 8:9, 4:3, 2:1, 3:1, 1.85:1, 2.39:1, or any other desired aspect ratio. The sub-assemblies 200 including the panels 104 can include any number of the panels 104 configured in any number of rows and columns. The sub-assemblies 200 may have aspect ratios of 1:2, 1:1, 16:9, 8:9, 4:3, 2:1, 3:1, 1.85:1, 2.39:1, or any other desired aspect ratio.

Figure 3A:
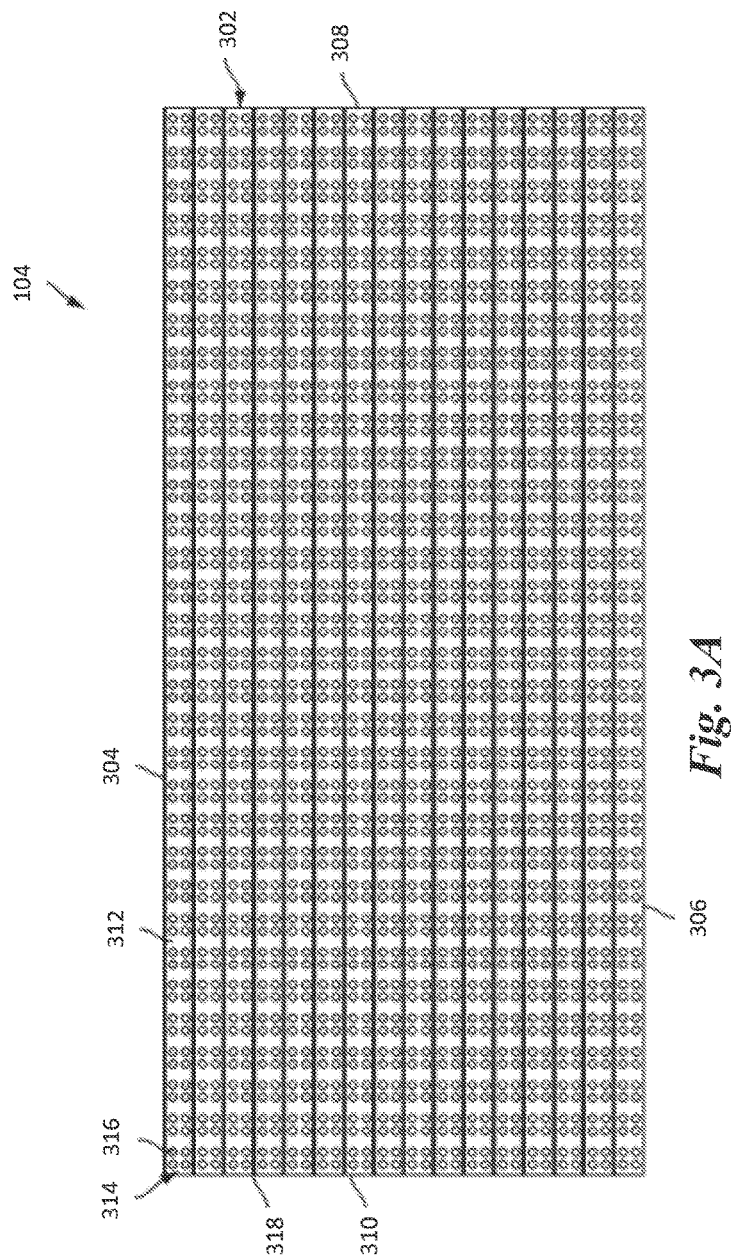

FIGS. 3A-3C illustrate a front view, a back view, and a top-down view, respectively, of a panel 104, in accordance with an embodiment. Specifically, FIG. 3A illustrates a front view of the panel 104 with illumination elements (e.g. LEDs 316) arranged in a 16×32 configuration, in accordance with an embodiment.

Referring to the example of FIG. 3A, the panel 104 includes a substrate 302 (e.g. a printed circuit board) that forms a front surface of the panel 104. The panel 104 may have a width W (e.g. between 1 foot and 4 feet) and a height H (e.g. between 0.5 feet to 2 feet), although other dimensions may be possible. In various embodiments, an aspect ratio of the panel 104 may be 2:1. In other embodiments, the aspect ratio of the panel 104 may be 1:2, 1:1, 16:9, 8:9, 4:3, 3:1, 1.85:1, 2.39:1, or any other desired aspect ratio. The substrate 302 in the present embodiment is rectangular in shape, with a top edge 304, a bottom edge 306, a right edge 308, and a left edge 310.

A substrate surface 312 includes "pixels" 314 that are formed by one or more LEDs 316 on or within the substrate 302. In the present example, each pixel 314 includes four LEDs 316 arranged in a pattern (e.g., a square). For example, the four LEDs 316 that form a pixel 314 may include a red LED, a green LED, a blue LED, and one other LED (e.g., a white LED). In various embodiments, the one other LED may be a sensor. It is understood that more or fewer LEDs 316 may be used to form a single pixel 314, and the use of four LEDs 316 and their relative positioning as a square is for purposes of illustration only.

In various embodiments, the substrate 302 may form the entire front surface of the panel 104, with no other part of the panel 104 being visible from the front when the substrate 302 is in place. In other embodiments, a housing (not separately illustrated) may be partially visible at one or more of the edges of the substrate 302. The substrate 302 may form the front surface of the panel 104, but may not be the outer surface in some embodiments. For example, a coating may overlay the substrate 302, thereby being positioned between the substrate 302 and the environment.

As one example, a potting material can be formed over the substrate 302. This material can be applied as a liquid, e.g., while heated, and then harden over the surface, e.g., when cooled. This potting material is useful for environmental protection, e.g., to achieve an IP rating of IP 65 or higher.

Louvers 318 may be positioned between adjacent row of pixels 314 to block or minimize light from directly striking the LEDs 316 from certain angles thereby improving contrast. For example, the louvers 318 may be configured to extend from the substrate 302 to a particular distance and/or at a particular angle needed to completely shade each pixel 314 when a light source (e.g., the sun) is at a certain position (e.g., ten degrees off vertical). In the present example, the louvers 318 extend the entire length of the substrate 302, but it is understood that other louver configurations may be used.

Referring to the example of FIG. 3B, the panel 104 includes a number of connection points on the back surface of the panel 104, including a "power in" point 320, a "data in" point 322, a main "data out" point 324, multiple optional/redundant data out points 326, and a "power out" point 328. The power in point 320 enables the panel 104 to receive power from a power source, which may be another panel. The data in point 322 enables the panel 104 to receive data from a data source, which may be another panel. The main data out point 324 enables the panel 104 to send data to another main panel. In some embodiments, the main data out point 324 and the optional/redundant data out points 326 may be combined. The power out point 328 enables the panel 104 to send power to another panel.

The connection points may be provided in various ways. For example, in one embodiment, the connection points may be jacks configured to receive corresponding plugs. In another embodiment, a cable may extend from the back panel with a connector (e.g., a jack or plug) affixed to the external end of the cable to provide an interface for another connector. It is understood that the connection points may be positioned and organized in many different ways.

Inside the panel 104, the power in point 320 and power out point 328 may be coupled to circuitry (not separately illustrated) as well as to a power supply. In such embodiments, the circuitry may aid in regulating the reception and transmission of power. In other embodiments, the power in point 320 and power out point 328 may by coupled only to the power supply with a pass through power connection allowing some of the received power to be passed from the power in point 320 to the power out point 328.

The data in point 322, the main data out point 324, and optional/redundant data out point 326 may be coupled to the circuitry. The circuitry may aid in regulating the reception and transmission of the data. In some embodiments, the circuitry may identify data used for the panel 104 and also send all data on to other coupled panels via the main data out point 324. In such embodiments, the other panels would then identify the information relevant to that particular panel from the data. In other embodiments, the circuitry may remove the data needed for the panel 104 and selectively send data on to other coupled panels via the main data out point 324. For example, the circuitry may send only data corresponding to a particular panel to that panel rather than sending all data and letting the panel identify the corresponding data.

The panel 104 may also include multiple coupling points or extensions 330 that can be used to couple the panel 104 to the frame 106. The coupling points 330 may be configured to receive pins or other protrusions from a locking plate and/or fasteners, which will be described later in greater detail. In some embodiments, the coupling points 330 may be protrusions or pins which are configured to be received by the frame 106. Some or all of the coupling points 330 may be accessible only from the rear side of the panel 104 and so are not shown in FIG. 3A. In other embodiments (not separately illustrated), the coupling points 330 may be disposed on the front surface of the panel 104.

Referring to the example of FIG. 3C, the panel 14o includes three sections in a side view. The first section 332 includes the LEDs (not separately illustrated) and louvers 318. The second section 334 and third section 336 may be used to house the circuitry and the power supply. Depths D1, D2, and D3 correspond to the first section 332, the second section 334, and the third section 336, respectively.

Figure 4A:
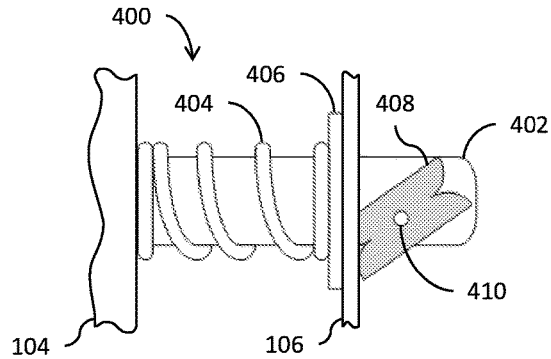
FIGS. 4A-4C illustrate a side view, a front view, and a top-down view, respectively, of a panel attached to a frame using a spring-latch, in accordance with an embodiment.
Figure 4B:
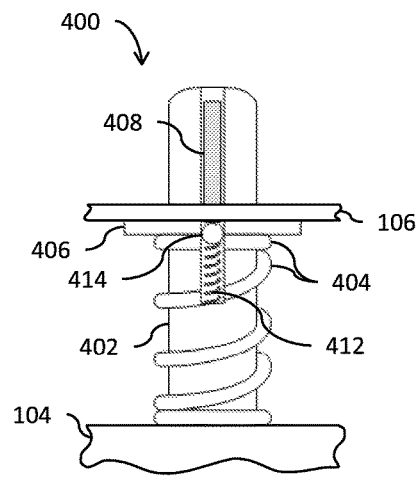

FIGS. 4A and 4B illustrate a side view and a front view of a panel 104 attached to a frame 106 by way of a spring-latch 400, respectively, in accordance with an embodiment. The spring-latch 400 may include a post 402, a spring 404, a collar 406, a butterfly pawl 408, and a pivot 410. The post 402 may extend through an opening 420 (illustrated in FIG. 4C) disposed in the frame 106 and the butterfly pawl 408 and the spring 404 may secure the post 402 in the opening 420 such that the panel 104 is attached to the frame 106. In some embodiments, spring-latches 400 may be used to attach panels 104 to sub-assemblies 200, as discussed above with respect to FIGS. 2C-2F.

The spring 404 may be a compression spring. The spring 404 may be a coil spring, a leaf spring, another type of spring, or the like. The spring 404 may apply a compressive force to the collar 406 and the panel 104 to push the collar 406 away from the panel 104. The spring 404 may be attached to any combination of the panel 104, the post 402, and the collar 406. The collar 406 may interface between the spring 404 and the frame 106. The collar 406 may be omitted in some embodiments.

The butterfly pawl 408 is attached to the post 402 by the pivot 410. The butterfly pawl 408 is rotatable around the pivot 410. The butterfly pawl 408 may be rotatable between a fastened position and an unfastened position. The butterfly pawl 408 may be configured to prevent the collar 406 and/or the frame 106 from moving past the butterfly pawl 408 in a direction away from the panel 104 when the butterfly pawl is in the fastened position. The butterfly pawl 408 may be further configured to allow the collar 406 and/or the frame 106 to move in either direction when the butterfly pawl is in the unfastened position.

The spring-latch 400 may be an example of the coupling points 330 illustrated in FIG. 3B and discussed above, in accordance with some embodiments. Spring-latches 400 may be attached to the backside of a panel 104, as illustrated in FIG. 3B; however, in other embodiments, the spring-latches may be attached to the front-side of a panel 104. Additionally, the spring-latches 400 may be attached to the frame 106 and the openings 420 may be disposed in either the front-side or the backside of a panel 104. As such, the panels 104 may be attached to the frame 106 from either the front-side or the backside.

The spring-latch 400 may further include a secondary spring 412 and a ball 414, as illustrated in FIG. 4B. The secondary spring 412 may be a compression spring. The secondary spring 412 may be a coil spring, a leaf spring, another type of spring, or the like. The secondary spring 412 and the ball 414 may be disposed in a channel (not separately illustrated) formed in the post 402 such that the secondary spring causes the ball 414 to contact the butterfly pawl 408. As will be discussed in reference to FIGS. 4D-4E, the secondary spring 412 and the ball 414 are configured to assist in rotating the butterfly pawl 408 between the fastened position and the unfastened position and retaining the butterfly pawl 408 in either the fastened position and the unfastened position.

Figure 4C:
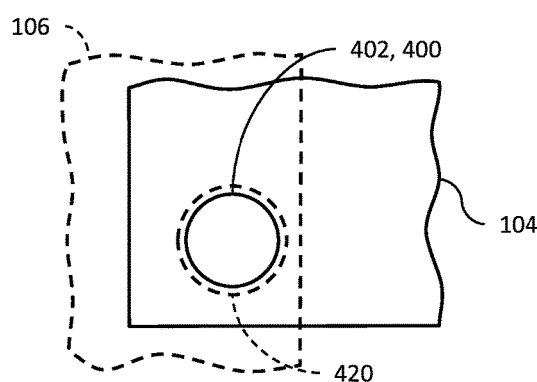

FIG. 4C illustrates a top-down view of a panel 104 attached to a frame 106 by the post 402 of the spring-latch 400 disposed in the opening 420. As illustrated in FIG. 4C, the opening 420 may have a diameter larger than an outer diameter of the post 402. Although not illustrated in FIG. 4C, the diameter of the opening 420 may be the same as an inner diameter of the collar 406, or larger or smaller than the inner diameter of the collar 406 and the spring 404 may have an inner diameter larger than the diameter of the collar 406 and/or the diameter of the opening 420. The diameter of the opening 420 may be between about 0.5 mm and about 20 mm, such as about 2-10 mm. The outer diameter of the post 402 may be between about 1 mm and about 20 mm, such as about 4-8 mm. The inner diameter of the collar 406 may be between about 0.6 mm and about 21 mm, such as about 4-9 mm. The inner diameter of the spring 404 may be between about 0.5 mm and about 21 mm, such as about 4-9 mm. However, in other embodiments, any diameter may be used for the opening 420, the outer diameter of the post 402, the inner diameter of the collar 406, and the inner diameter of the spring 404.

Figure 4D:
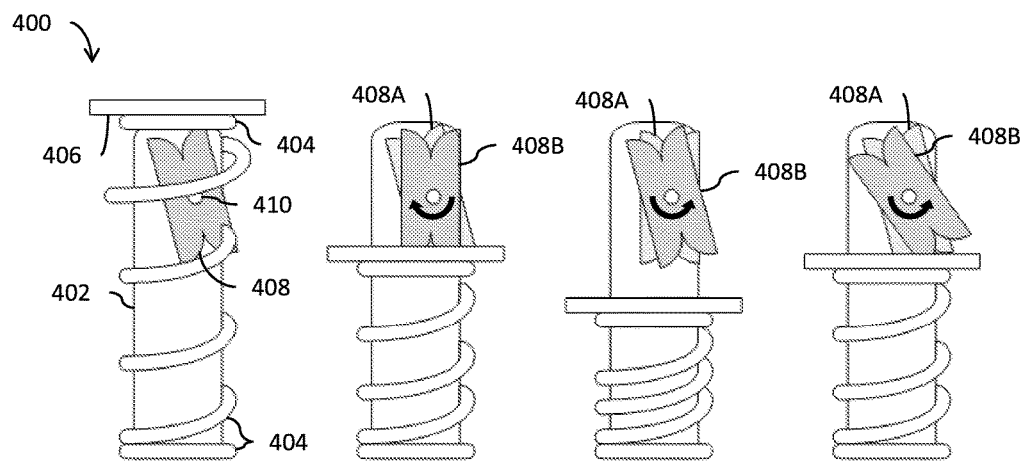
FIGS. 4D-4G illustrate the operation of a spring-latch, in accordance with various embodiments.
Figure 4E:
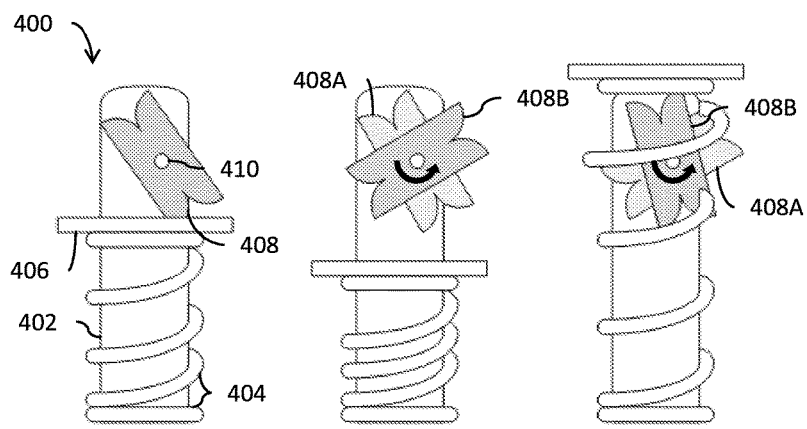
Figure 4F:
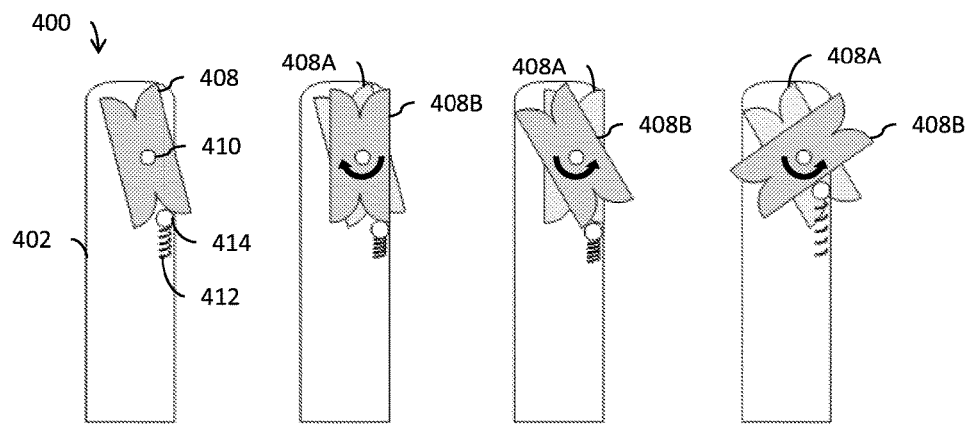
Figure 4G:
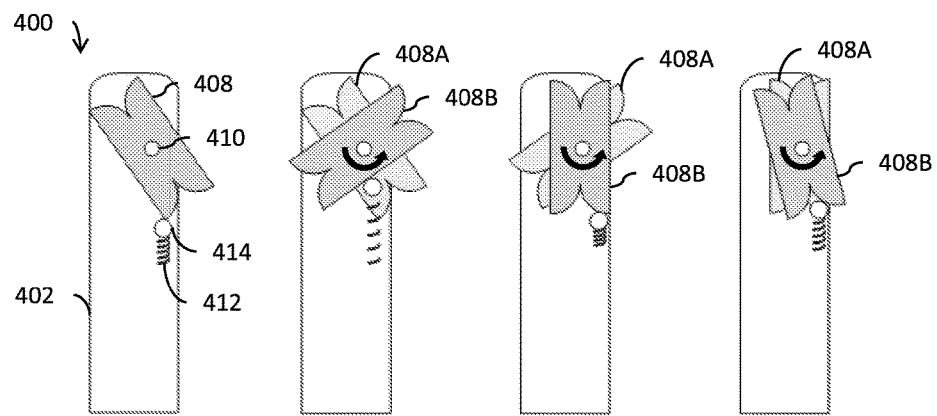

FIGS. 4D and 4E illustrate the butterfly pawl 408 pivoting from the unfastened position to the fastened position and the butterfly pawl 408 pivoting from the fastened position to the unfastened position, respectively, and FIGS. 4F and 4G illustrate the interaction between the secondary spring 412, the ball 414, and the butterfly pawl 408 as the butterfly pawl 408 is pivoted from the unfastened position to the fastened position and from the fastened position to the unfastened position, respectively, in accordance with several embodiments. In each of FIGS. 4D-4G, reference numeral 408A represents an initial position of the butterfly pawl 408 and reference numeral 408B represents the position of the butterfly pawl 408 after the butterfly pawl has been rotated in a direction indicated by an arrow.

As shown in FIG. 4D, the butterfly pawl 408 is pivoted from the unfastened position to the fastened position by moving the collar 406 down the post 402, then allowing the spring 404 to move the collar 406 back up the post 402. As the collar 406 moves down the post 402, the collar 406 contacts the butterfly pawl 408 and moves the butterfly pawl 408 in the clockwise direction. Once the collar 406 moves below a bottommost portion of the butterfly pawl 408, the secondary spring 412 and the ball 414 move the butterfly pawl 408 in the counter-clockwise direction back to the unfastened position. The spring 404 then moves the collar 406 vertically upwards such that the collar 406 comes into contact with the butterfly pawl 408 and moves the butterfly pawl 408 in the counter-clockwise direction into the fastened position. Once the butterfly pawl 408 reaches the fastened position, the butterfly pawl 408 prevents the collar 406 from moving any further upwards in the vertical direction.

As shown in FIG. 4E, the butterfly pawl 408 is pivoted from the fastened position to the unfastened position by moving the collar 406 down the post 402, then allowing the spring 404 to move the collar 406 back up the post 402. As the collar 406 moves down the post 402, the collar 402 contacts the butterfly pawl 408. The collar 406 rotates the butterfly pawl 408 in the clockwise direction. Once the collar 406 moves below the bottommost portion of the butterfly pawl 408, the secondary spring 412 and the ball 414 rotate the butterfly pawl 408 counter-clockwise back to the fastened position. The spring 404 then moves the collar 406 vertically upwards. The collar 406 comes into contact with the butterfly pawl 408 and rotates the butterfly pawl 408 counter-clockwise such that the butterfly pawl 408 is pivoted to the unfastened position. The collar 406 is then free to move vertically upwards or downwards.

As shown in FIG. 4G, initially, the secondary spring 412 and the ball 414 apply a force to the butterfly pawl 408 in order to retain the butterfly pawl 408 in the unfastened position. As the collar 406 moves vertically down the post 402, the butterfly pawl 408 rotates clockwise, the secondary spring 412 is depressed, and the ball 414 moves vertically downward. Once the top of the collar 406 passes the bottommost portion of the butterfly pawl 408, the secondary spring 412 extends pushing the ball 414 vertically upwards and the ball 414 rotates the butterfly pawl 408 counter-clockwise back to the unfastened position. As the collar 406 moves back vertically upwards, the collar 406 rotates the butterfly pawl 408 counter-clockwise into the fastened position, the secondary spring 412 is depressed, and the ball 414 moves vertically downward.

As shown in FIG. 4G, initially, the secondary spring 412 and the ball 414 apply a force to the butterfly pawl 408 in order to retain the butterfly pawl 408 in the fastened position. As the collar 406 moves vertically down the post 402, the butterfly pawl 408 rotates clockwise, the secondary spring 412 is depressed, and the ball 414 moves vertically downward. Once the top of the collar 406 passes the bottommost portion of the butterfly pawl 408, the secondary spring 412 extends pushing the ball 414 vertically upwards and the ball 414 rotates the butterfly pawl 408 counter-clockwise past the fastened position. As the collar 406 moves back vertically upwards, the collar 406 rotates the butterfly pawl 408 counter-clockwise into the unfastened position, the spring 414 is initially depressed and then extended, and the ball 414 moves vertically downward and then upward.

Accordingly, a panel 104 may be attached to a frame 106 by pressing the post 402 into the opening 42o disposed in the frame 106 while the butterfly pawl 408 is in the unfastened position. As the post 402 is pressed into the opening 420, the butterfly pawl 408 pivots clockwise. Once the backside of the frame 106 passes the butterfly pawl 408, the butterfly pawl 408 rotates counter-clockwise to return to the unfastened position. The spring 404 pushes the collar 406 and the frame 106 away from the panel 104 and the butterfly pawl 408 pivots counter-clockwise to the fastened position. The post 402 inserted into the opening 420 maintains the panel 104 in alignment with the frame 106 in the X and Y directions. The combination of the spring 404 and the butterfly pawl 408 maintains the position of the panel 104 in the Z direction.

The panel 104 may then be removed from the frame 106 by pressing the panel 104 towards the frame 106. Once the back side of the frame 106 passes the butterfly pawl 408, the butterfly pawl 408 rotates counter-clockwise. The spring 404 pushes the collar 406 and the frame 106 away from the panel 104 and the frame 106 and collar 406 rotate the butterfly pawl 408 counter-clockwise into the unfastened position. The panel 104 may then be removed from the frame 106.

The spring 404 may have a sufficiently high spring coefficient that the panels 104 cannot be removed from the frame 106 or the sub-assembly 200 by natural forces such as wind. In some embodiments, the spring 404 may have a sufficiently high spring coefficient that a lever tool is required to attach or remove the panels 104 from the frame 106.

The spring-latches 400 may include various locking mechanisms to ensure that the panels 104 cannot be removed from a frame 106 or a sub-assembly 200 by an unauthorized user. For example, a user may rotate the spring-latches 400 to a locked position once a panel 104 is attached to a frame 106 such that the spring-latches 400 are locked and the panel 104 cannot be removed from the frame 106. The user may turn the spring-latches 400 a quarter turn, a half turn, or the like in order to lock the spring-latches 400. The user may use a mechanical key, a magnetic key, another type of key, or the like in order to rotate the spring-latches 400 to the locked position. The spring-latches 400 may require the key in order to rotate the spring-latches to the locked position or back to an unlocked position.

Additional mechanisms may also be included in order to ensure that the panels 104 remain attached to the frame 106 despite adverse weather or other conditions. For example, the spring-latches 400 may include a screw mechanism (not separately illustrated) that locks the spring-latches 400 of the panels 104 in the openings 420 of the frame 106. More specifically, the screw mechanism may be rotated to lock a panel 104 in place on a frame 106 once the panel 104 has been attached to the frame 106. The screw mechanism may be rotated in the opposite direction to unlock the panel 104 from the frame 106, allowing the panel 104 to be removed from the frame 106.

In view of the above, the following observations may be made. In an embodiment, one or more spring-latches 400 are provided such that panels 104 can be installed and removed from frames 106 or sub-assemblies 200 by simply pressing the panels 104 into the frames 106 or the sub-assemblies 200 to pivot the butterfly pawls 408 from the unfastened to position to the fastened position or from the fastened position to the unfastened position. This facilitates fast and efficient installation and removal of the panels 104 from the frames 106 and the sub-assemblies 200. Moreover, the spring-latches 400 do not require any specialized tools or expertise to install or remove.

FIGS. 5A-5D illustrate back views of a latch arrangement for attaching the panels 104 to the frame 106 or the sub-assembly 200, in accordance with an embodiment. As shown in FIGS. 5A-5D, each of the panels 104 may include spring-latches 400, as described in reference to FIGS. 4A-4G, and/or support posts 500 (FIG. 5B) disposed on the backside of the panels 104. The spring-latches 400 may function as coupling points 330, as described in reference to FIG. 3B, which couple the panels 104 to the frame 106 or the sub-assembly 200, as described in reference to FIGS. 4A-4G.

The spring-latches 400 may be configured to both align the panels 104 with and secure the panels 104 to the frame 106 or the sub-assembly 200. The support posts 500 may differ from the spring-latches 400 in that the support posts 500 do not include a spring 404, a butterfly pawl 408, and other associated parts. The support posts 500 may simply be column-shaped posts which are configured to align the panels 104 with a frame 106 or a sub-assembly 200, without securing the panels 104 to the frame 106 or the sub-assembly 200. The spring-latches 400 and the support posts 50o are configured to be received by the openings 420 which are disposed in a frame 106 or a sub-assembly 200. In some embodiments, spring-latches 400 and the support posts 500 may be disposed on the front-side of the panels 104. In other embodiments, the spring-latches 400 and the support posts 500 may be disposed on a frame 106 or a sub-assembly 200 and the openings 420 configured to receive the spring-latches 400 or support posts 500 may be disposed on the front-side or the backside of the panels 104. Because the spring-latches 400 and/or openings 420 may be disposed on either the front-side or the backside of the panels 104, the panels 104 may be serviceable from either the front-side or the backside.

Figure 5A:
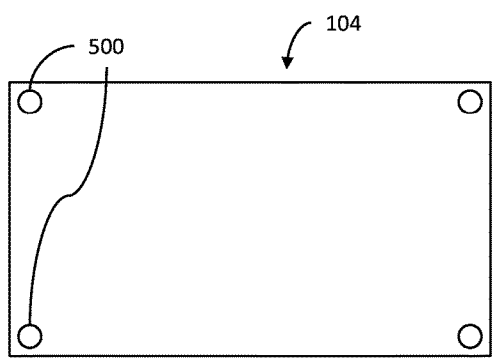
FIGS. 5A-5D illustrate back views of a latch arrangement for attaching panels to a frame or a sub-assembly, in accordance with various embodiments.
Figure 5B:
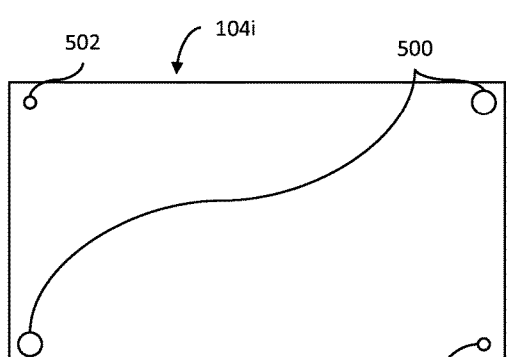
Figure 5C:
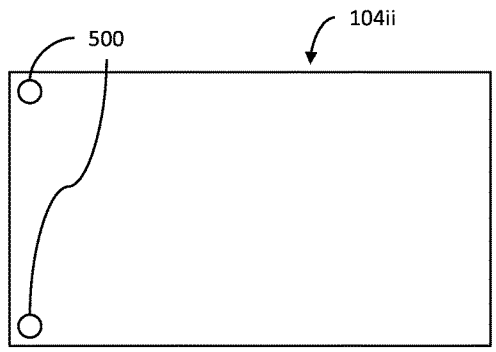
Figure 5D:
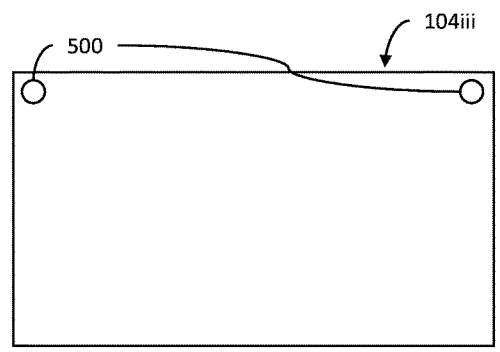

As shown in FIG. 5A, a panel 104 may include four spring-latches 400, each of the spring-latches 400 being disposed in a corner of the panel 104. In some embodiments, a panel 104 may include support posts 500 in addition to the spring-latches 400. For example, as shown in FIG. 5B, a panel 104i may include two of the spring-latches 400 disposed in opposite corners of the panel 104i and two support posts 50o disposed in the remaining two corners of the panel 104i opposite each other. As shown in FIG. 5C, a panel 104ii may include two spring-latches 400 disposed on a short side of the panel 104ii. In some embodiments, as shown in FIG. 5D, a panel 104iii may include two spring-latches 400 disposed on a long side of the panel 104iii. In still other embodiments, a panel 104 may include any number of spring-latches 400 and any number of support posts 500 configured in any arrangement in order to securely attach the panels 104 to a frame 106 or a sub-assembly 200.

Figure 6A:
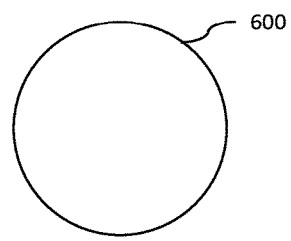
FIGS. 6A-6D illustrate top-down views of a post, in accordance with various embodiments.
Figure 6B:
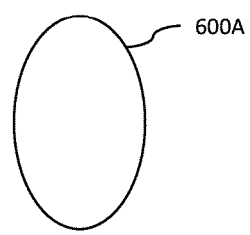
Figure 6C:
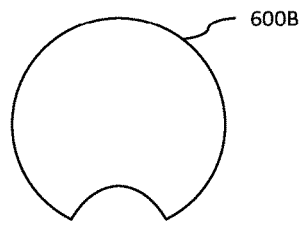
Figure 6D:
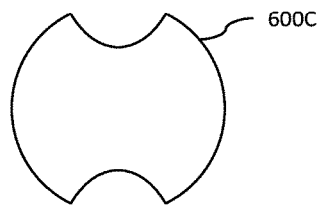

FIGS. 6A-6D illustrate top views of a post 600, in accordance with various embodiments. As shown in FIG. 6A, a post 600 may have a circular shape. In some embodiments, as shown in FIG. 6B, a post 600A may have an ellipsoidal shape. In other embodiments, as shown in FIG. 6C, a post 600B may have a circular shape having a groove formed therein. In still other embodiments, as shown in FIG. 6D, a post 600C may have a circular shape having multiple grooves formed therein. For example, the post 600C may have two grooves, three grooves, four grooves, or any other suitable number of grooves. The post 600 may have additional alternative shapes, such as a square shape, a rectangular shape, a polygonal shape, or any other suitable shape.

Figure 7A:
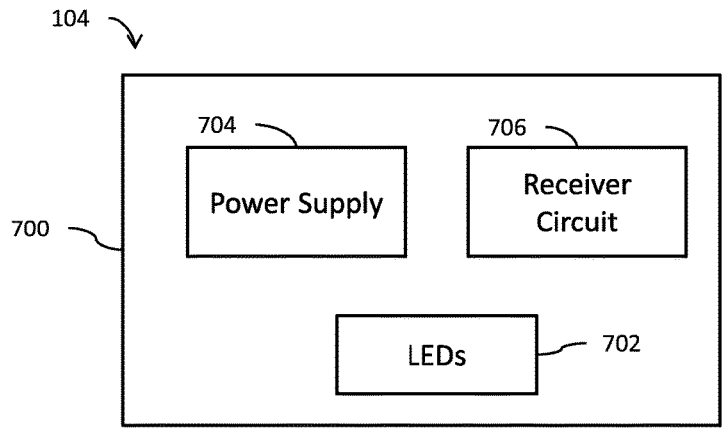
FIGS. 7A and 7B illustrate a panel, in accordance with various embodiments.
Figure 7B:
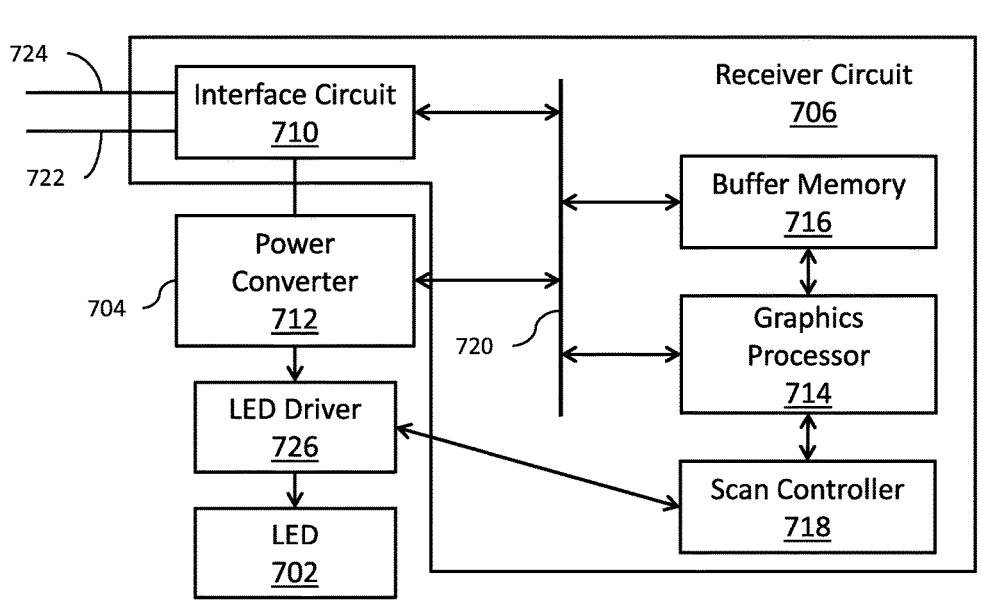

FIGS. 7A and 7B illustrate a panel 104, in accordance with some embodiments. FIG. 7A illustrates a block diagram of the components of the panel 104, in accordance with an embodiment. FIG. 7B illustrates another block diagram of the components of the panel 104, in accordance with an embodiment.

FIG. 7A illustrates a panel 104 which includes a housing 700, in accordance with an embodiment. The housing 700 contains an LED receiver circuit 806, a power supply 704, and LEDs 702 on or within a substrate such as the substrate 402. The LED receiver circuit 706 is coupled to the LEDs 702. The power supply 704 provides power to the panel 104 components, such as the LEDs 702 and the LED receiver circuit 706. The LEDs 702 may be the same as or similar to the LEDs 316.

In an embodiment, the LED receiver circuit 706 may be a single chip mounted on a PCB. Alternatively, the LED receiver circuit 706 may comprise of many components mounted on a PCB or a separate PCB. The LED receiver circuit 706 may be configured to process received media and control the operation of the individual LEDs 702 or control a driver circuit (discussed below) that controls individual LEDs 702. As an example, the LED receiver circuit 706 may determine the color of the LEDs 702 to be displayed at each location (pixel). In an embodiment, the LED receiver circuit 706 may receive digital packets or analog signals from an external computer or controller. The LED receiver circuit 706 may then decode, buffer, or perform other signal processing on the received digital packets or analog signals and form a representation of an image to be displayed by controlling the LEDs 702 accordingly.

Similarly, the LED receiver circuit 706 may determine the brightness at each pixel location, for example, by controlling the current supplied to the LEDs 702. In another embodiment, the brightness of the LED 702 may be controlled by turning the LED on and off via pulse-width-modulation (PWM). In some embodiments, the LED receiver circuit 706 and the power supply 704 are configured with both capabilities.

The power supply 704 is typically configured to provide a constant-current drive to the LEDs 702. In some embodiments, the power supply 704 is configured to provide a constant Direct Current (DC) voltage to the LEDs 702. In an embodiment, the power supply unit 704 may comprise a power converter for converting Alternating Current (AC) to DC, which is then supplied to the LEDs 702. In an embodiment, the power supply 704 converts a 240V or 120V AC to several volts up to in some cases 24V DC. As an example, a display panel may operate at 4.2 V DC, for example, 160 Watts to the LEDs 702 of the panel 104. Advantageously, a display panel can handle either 240V or 120V AC and is therefore compatible worldwide.

In another embodiment, the power supply 704 may comprise a down converter that down converts the voltage suitable for driving the LEDs 702. As an example, the down converter may down convert a DC voltage at a first level (e.g., 12V, 24V, or 48V DC) to a DC voltage at a second level (e.g., 4.2V DC) that is lower than the first level. Examples of down converters (DC-DC converters) include linear regulators and switched mode converters such as buck converters.

In some embodiments, the output from the power supply unit 704 is isolated from the input power, also known as isolated converters. Accordingly, in various embodiments, the power supply 704 may comprise a transformer. In another embodiment, the power supply 704 may comprise forward, half-bridge, full-bridge, or push-pull topologies.

In some embodiments, the ground of the power supply 704 may be isolated from the body of the housing 700 and/or the LED receiver circuit 706 to reduce noisy ground loops (not shown as it is implemented in the board layout internal to the PCB). In an electrical system, a ground loop occurs when a ground reference at two different locations of a circuit have different potentials. A ground loop can cause interference and noise in the video feed and at the LED receiver circuit 706. In an embodiment, the power supply 704 may be placed inside a faraday cage to minimize RF interference with other components. The power supply 704 may also include a control loop circuit to control output current.

Each of the panels 104 may have ports and mounting latches to connect to adjacent panels 104. In these embodiments, data and/or power may be received for only the panel 104 or may be passed on to one or more other panels 104. Accordingly, the LED receiver circuit 706 and/or power supply 804 may be configured to pass data and/or power to other panels 104 in some embodiments. The control signals and external power may also be fed to each panel 104 in a daisy chain or individually. In some embodiments, the panel 104 may have a socket for a registered jack (RJ) 45 standard interface. The RJ45 interface allows the display panel to receive signals digital packets or analog signals from an external computer.

In the present example, the housing 700 is sealed to prevent water from entering the housing 700. For example, the housing 700 may be sealed to have an ingress protection (IP) rating such as IP65 or higher, e.g., IP67, which defines a level of protection against both solid particles and liquids. This ensures that the panel 104 can be mounted in inclement weather situations without being adversely affected. In such embodiments, the cooling may be passive as there are no vent openings for air intakes or exhausts. The housing 700 may be made of a thermally conductive material (e.g., aluminum, carbon fiber composite, titanium alloys, thermally conductive plastic) that is relatively light-weight and rigid.

FIG. 7B illustrates a system diagram schematic of the panel 104, in accordance with an embodiment. The panel 104 comprises an LED receiver circuit 706, a power supply 704, an LED driver 726, and LEDs 702. The LED receiver circuit 706 comprises an interface circuit 710, a receiver bus 720, a buffer memory 716, a graphics processor 714, and a scan controller 718. The power supply 704 comprises a power converter 712.

The incoming power from the power supply 704 is provided to the components of the panel 104, such as the power converter 712, which supplies the power to the LED driver 726. Generally, the incoming power is supplied from an AC power source, which can be 120V or 240V. The power converter 712 converts and regulates the AC power to DC voltage or regulates the current.

Normally, the LED driver 726 provides constant-current to the LEDs 702 while allowing the voltage to vary depending on the load. In general, the regulated current can vary from a couple hundred milliamps to an amperage of current.

In some embodiments, the power supply 704 may be configured to provide constant-voltage commonly around 1V DC to 10V DC. In some embodiments, a constant-current driver is part of the LED assembly and the power supply provides constant-voltage to the constant-current driver. In these embodiments, the current flowing through the LEDs are controlled using resistors or built-in regulators.

The forward voltage of an LED is the amount of voltage that is required for it to emit light. Generally the forward voltage of an LED varies within several volts, which is dependent on the type of LED (i.e., a Red LED typically has a forward voltage of 1.8V). As a general rule, the forward voltage increases as the light frequency increases.

The panel 104 receives data and power signals at the input cable 722. Another output from the incoming power may be provided to the output cable 724. This may provide redundancy so that even if a component in the panel 104 is not working, the output power is not disturbed. Similarly, the output cable 724 includes all the data packets being received in the input cable 722.

The integrated power and data cables, input cable 722 and output cable 724, include wires for carrying data/control information and wires for carrying power. The data/control wires may be of the twisted pair variety. In some embodiments, the power and data cables are not integrated and several cables may be required to transmit the data and power signals (not separately illustrated). The length of the data and power wires may be controlled to provide signal propagation within each LED display panel within a specific time. The data/control wires may be configured to transport data at a high bit rate, e.g., at least 1 Mbit/s, and may be 100-1000 Mbit/s. To minimize noise, the cable as a whole may be shielded or the data/control wires or twisted pairs of data/control wires may be shielded separately. In some embodiments, the power connections to the power wires can be configured so that power is run across all of a row (or any other group of panels). In this manner, if the power supply of any one of the panels fails, the other panels will continue to operate.

The data and power signal received at the input cable 722 is processed at the interface circuit 7100. The interface circuit 710 provides received data packets to the graphics processor 714 through a receiver bus 720. In some embodiments, the interface circuit 710 provides only the data packets intended for the panel 104. In other embodiments, the interface circuit 710 provides all incoming data packets to the graphics processor 714. For example, in some embodiments, the graphics processor 714 may perform decoding of the received media. The graphics processor 714 may use the buffer memory 716, or frame buffer, as needed to store media packets during processing. The graphics processor 714 may perform additional signal processing techniques on the packets, such as decrypting, to provide the necessary signals for displaying the image for the panel 104.

A scan controller 718, which may include an address decoder, receives the media to be displayed, and identifies individual LEDs that need to be controlled. The scan controller 718 (alternately, the LED Driver 726) may determine an individual LED's color, brightness, refresh time, and other parameters associated to generate the display. In one embodiment, the scan controller 718 may provide this information to the LED driver 726, which selects the appropriate current for the particular LED.

Alternatively, in an embodiment, the scan controller 718 may interface directly with the LEDs 702. For example, the LED driver 726 provides a constant current to the LEDs 702 while the scan controller 718 controls the select line needed to turn ON or OFF a particular LED. Further, in various embodiments, the scan controller 718 may be integrated into the LED driver 726.

As discussed above in connection with FIGS. 1A-1B, each panel 104 of the array of panels 104 is electrically connected to an adjacent panel 104 within the same row as the panel 104 and/or an adjacent panel 104 within the same column as the panel 104. This may be accomplished using the embodiments shown in FIGS. 8A-8C.

Figure 8A:
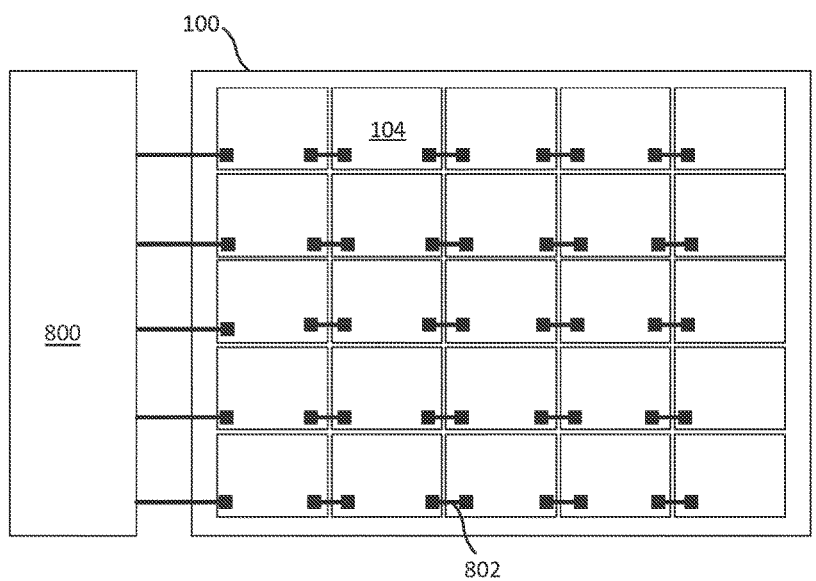
FIGS. 8A-8C illustrate multi-panel displays and sub-assemblies formed by connecting panels together using various methods, in accordance with various embodiments.
Figure 8B:
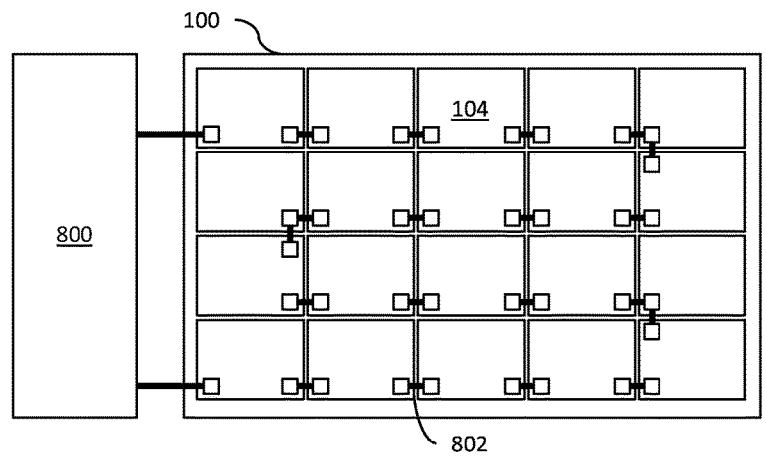
Figure 8C:
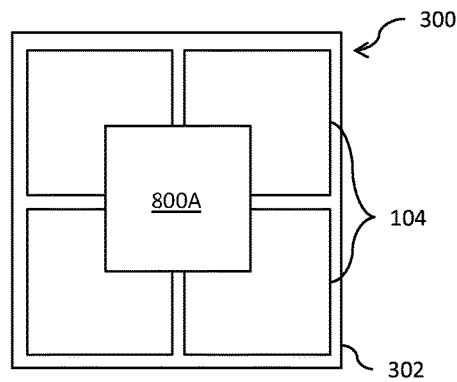

FIGS. 8A-8C illustrate multi-panel displays 100 and sub-assemblies 200 formed by connecting panels 104 together using various methods, in accordance with various embodiments. FIG. 8A illustrates a multi-panel display 100 formed by connecting panels 104 together using input/output cables 802, in accordance with an embodiment. As shown in FIG. 8A, for each row, a panel 104 at a first end of a row receives an input data connection from a data source (e.g., a data receiver box 800) and has an output data connection to a succeeding panel 104 in the row. The data receiver box 800 is configured to provide power, data, and communications to the panels 104. Each succeeding panel 104 provides data to a next adjacent panel 104 until the panel 104 at a second end of the row is reached. A power line is run across each row to power the panels 104 in that row. The panels 104 may be electrically connected together for data and/or power by the input/output cables 802.

FIG. 8B illustrates a multi-panel display 100 formed by connecting panels 104 together using input/output cables 802, in accordance with another embodiment. As shown in FIG. 8B, each of the panels 104 is connected to a first panel in the same row or column as the panel 104 and either a second panel in the same row or column as the panel 104 or a data source (e.g., the data receiver box 800). The panels 104 are connected to the first panels, second panels, and the data receiver box 800 by input/output cables 802. Each succeeding panel 104 provides data to a next adjacent panel 104 in a snaking fashion until the panel 104 adjacent the data receiver box 800 is reached. The data receiver box 800 may be connected to two panels 104 at either end of the panel connection chain. As such, the panels 104 may be configured as a redundant daisy chain. A power line may be run across the panels 104 in the same manner as the input/output cables 802. The panels 104 may be electrically connected together for data and/or power by the input/output cables 802. In this embodiment, the panels 104 may receive data and/or power even if one or more of the panels 104 is removed from the display 1oo.

FIG. 8C illustrates a sub-assembly 200 including a sub-assembly frame 302, four panels 104 arranged in two columns of two rows, and a sub-assembly data receiver box 800A. The sub-assembly data receiver box 800A may be centrally located in a corner region between the four panels 104. The sub-assembly data receiver box 800A may be connected to each of the four panels 104. The sub-assembly data receiver box 800A may include the power supply and receiver circuit (similar to FIG. 8B) in one embodiment and may supply data and/or power to each of the four panels 104. In this embodiment, the panels 104 may receive data and/or power from the sub-assembly data receiver box 800A even when one or more of the panels 104 is removed from the sub-assembly 200.

Figure 9:
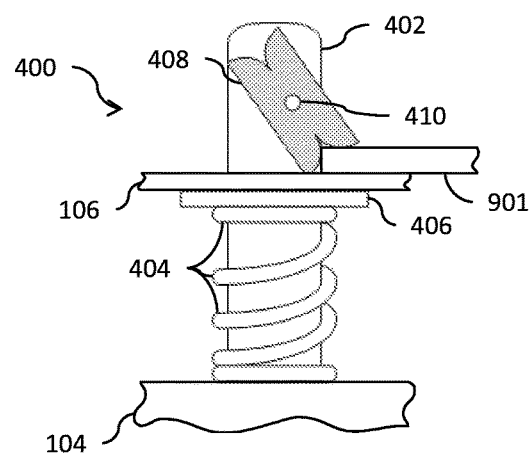
FIG. 9 illustrates a spring-latch including a locking mechanical arm, in accordance with an embodiment.

FIG. 9 illustrates a display panel including a spring-latch 400 including a mechanic arm 901. As illustrated in FIG. 9, the spring-latch 400 may be used to attach a panel 104 to a frame 106. The spring-latch 400 may be the same or similar to the spring-latches 400 described above in reference to FIGS. 4A-4G. The spring-latch 400 may include a post 402, a spring 404, a collar 406, a butterfly pawl 408, and a pivot 410.

The mechanical arm 901 may be configured to lock the spring-latch 400 by locking the butterfly pawl 408 in place. For example, once the mechanical arm 901 is in a locked position, as illustrated in FIG. 9, the butterfly pawl 408 cannot move from the fastened position to the unfastened position, even if the panel 104 is pressed towards the frame 106. The mechanical arm 901 may be configured rotate, slide, pivot, or the like into and out of the locked position illustrated in FIG. 9 such that the butterfly pawl 408 can be locked or unlocked. A key, such as a magnetic key, a mechanical key, or any other type of key may be required in order to move the magnetic arm 901 between the locked position and an unlocked position. Once the magnetic arm 901 is moved to the unlocked position, the butterfly pawl 408 may be released and the spring-latch 400 may operate normally. Accordingly, the mechanical arm 901 can be used with the spring-latches 400 in order to lock the panels 104 to the frame 106 such that neither unauthorized users, nor adverse weather or other conditions cannot remove the panels 104 from the frame 106.

Although in various embodiments, the design of the panel including the latch and locking mechanisms have been described, in alternative embodiments, these features may be introduced into the support structure or frame so that the panels are designed as generic units that can be attached to any type of supporting structure. In such embodiments, for example, the spring latch including the butterfly pawl described in various embodiments above, may be included in the support structure while the panel may include a hole for the post of the spring latch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multi-panel display comprising:
a frame; and
a plurality of panels, each of the panels being attached to the frame by a first spring-latch, the first spring-latch comprising a butterfly pawl, the butterfly pawl being configured to switch between a fastened position and an unfastened position by pressing the panel towards the frame and releasing the panel, wherein the frame or the plurality of panels comprises a mounting surface, wherein the butterfly pawl is configured to contact the mounting surface and extend through the mounting surface when the butterfly pawl is in the fastened position.

2. The multi-panel display of claim 1, further comprising a plurality of sub-assemblies, each of the plurality of panels being attached to a corresponding one of the sub-assemblies, each of the sub-assemblies being attached to the frame.

3. The multi-panel display of claim 1, wherein the frame comprises a plurality of holes, and wherein the first spring-latch is configured to be fastened to a corresponding one of the plurality of holes.

4. The multi-panel display of claim 1, wherein each of the panels of the plurality of panels comprises a plurality of light emitting diodes (LEDs) attached to a front side of the panel, and wherein the first spring-latch is attached to the front side of the panel.

5. The multi-panel display of claim 1, wherein each of the panels of the plurality of panels comprises a plurality of light emitting diodes (LEDs) attached to a front side of the panel, and wherein the first spring-latch is attached to the back side of the panel.

6. The multi-panel display of claim 1, wherein each of the panels is attached to the frame by the first spring-latch and three additional spring-latches, the first spring-latch and each of the additional spring-latches being disposed in a separate corner of the panel.

7. The multi-panel display of claim 1, wherein each of the panels is attached to the frame by the first spring-latch and a second spring-latch, the first spring-latch and the second spring-latch being disposed on a same side of the panel.

8. The multi-panel display of claim 7, wherein each of the panels of the plurality of panels further comprises a plurality of posts, the plurality of posts being configured to align the panel with the frame.

9. A display panel comprising:
a display surface at a first side;
a spring-latch at an opposite second side, the spring-latch comprising:
a post,
a butterfly pawl attached to the post by a pivot, the butterfly pawl being rotatable around the pivot, the butterfly pawl being rotatable between a fastened position and an unfastened position,
a collar disposed around the post, the collar being configured to move up and down the post,
a first spring connected to the collar, the first spring configured to push the collar up the post,
a ball disposed below the butterfly pawl, and
a second spring configured to press the ball against the butterfly pawl.

10. The display panel of claim 9, wherein the post has a circular shape in a cross-sectional view.

11. The display panel of claim 9, wherein the post has an ellipsoidal shape in a cross-sectional view.

12. The display panel of claim 9, wherein the post comprises one or more grooves in a cross-sectional view.

13. The display panel of claim 9, wherein the collar is configured to move the butterfly pawl between the fastened position and the unfastened position.

14. The display panel of claim 9, wherein the collar is configured to move vertically up or down the post past the butterfly pawl when the butterfly pawl is in the unfastened position, and wherein the collar is configured to only move vertically down the post past the butterfly pawl when the butterfly pawl is in the fastened position.

15. A method for mounting a display panel comprising:
providing a display panel comprising a spring-latch, the spring-latch comprising a first spring;
providing a frame comprising an opening, the opening corresponding to the spring-latch;
inserting the spring-latch into the opening; and
attaching the display panel to the frame by pressing the display panel towards the frame and releasing the display panel such that the first spring switches the spring-latch from an unfastened position to a fastened position.

16. The method of claim 15, wherein the spring-latch comprises a butterfly pawl, and wherein switching the spring-latch from the unfastened position to the fastened position comprises rotating the butterfly pawl from a first position to a second position.

17. The method of claim 15, further comprising removing the display panel from the frame by pressing the display panel towards the frame such that the first spring-switches the spring-latch from the fastened position to the unfastened position.

18. The method of claim 15, wherein the spring-latch further comprises a collar configured to contact the frame, a second spring configured to contact the collar, and a butterfly pawl configured to switch between the fastened position and the unfastened position, and wherein after the display panel is released, the second spring presses the collar away from the display panel such that the collar rotates the butterfly pawl into the fastened position.

19. The method of claim 15, wherein a lever is used to press the display panel towards the frame.

20. The method of claim 15, further comprising locking the display panel to the frame, and wherein the locking prevents the display panel from being removed from the frame by pressing the display panel towards the frame.

21. The method of claim 20, wherein the display panel is locked to the frame using a magnetic keyed lock.

22. The method of claim 20, wherein the display panel is locked to the frame using a mechanical arm that locks a butterfly pawl.

\* \* \* \* \*